(12) United States Patent
Flachowsky et al.

(10) Patent No.: US 8,679,921 B2
(45) Date of Patent: Mar. 25, 2014

(54) CANYON GATE TRANSISTOR AND METHODS FOR ITS FABRICATION

(75) Inventors: Stefan Flachowsky, Dresden (DE); Thilo Scheiper, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 107 days.

(21) Appl. No.: 13/283,370

(22) Filed: Oct. 27, 2011

(65) Prior Publication Data

US 2013/0105885 A1     May 2, 2013

(51) Int. Cl.
*H01L 21/336* (2006.01)
(52) U.S. Cl.
USPC ............ 438/270; 438/272; 257/E21.41
(58) Field of Classification Search
USPC .............. 257/330, 332, E21.41, E29.262; 438/270, 272
See application file for complete search history.

(56) References Cited

U.S. PATENT DOCUMENTS

| | | | | |
|---|---|---|---|---|
| 5,016,067 A | * | 5/1991 | Mori | 257/330 |
| 5,021,355 A | * | 6/1991 | Dhong et al. | 438/270 |
| 7,633,120 B2 | * | 12/2009 | Hebert | 257/330 |
| 8,232,592 B2 | * | 7/2012 | Yoon | 257/329 |

* cited by examiner

*Primary Examiner* — Tuan N. Quach
(74) *Attorney, Agent, or Firm* — Ingrassia Fisher & Lorenz, P.C.

(57) ABSTRACT

Lithographic limitations on gate and induced channel length in MOSFETS are avoided by forming non-planar MOSFETS in a cavity extending into a semiconductor substrate. The gate insulator and channel region lie proximate a cavity sidewall having angle α preferably about ≥90 degrees with respect to the semiconductor surface. The channel length depends on the bottom depth of the cavity and the depth from the surface of a source or drain region adjacent the cavity. The corresponding drain or source lies at the cavity bottom. The cavity sidewall extends therebetween. Neither depth is lithographic dependent. Very short channels can be consistently formed, providing improved performance and manufacturing yield. Source, drain and gate connections are brought to the same surface so that complex circuits can be readily constructed. The source and drain regions are preferably formed epitaxially and strain inducing materials can be used therein to improve channel carrier mobility.

20 Claims, 13 Drawing Sheets

CANYON GATE TRANSISTOR AND METHODS FOR ITS FABRICATION

FIELD OF THE INVENTION

This invention relates generally to structures and methods for forming semiconductor devices, especially non-planar field effect transistors (FETs).

BACKGROUND OF THE INVENTION

In the field of electronics, the planar metal-oxide-semiconductor (MOS) field effect transistor (FET) is widely used. In planar devices, the conductive channel that gives rise to device operation lies approximately parallel to the semiconductor surface on or in which the planar MOSFET is formed. As the fabrication technology has improved, there has been an ongoing effort to shrink the dimensions of the individual MOSFETs so that denser and more complex integrated circuits (ICs) can be fabricated. With the planar MOSFET, the gate length and corresponding induced source-drain channel length or spacing and uniformity are largely controlled by lithographic capabilities, for example, the lithographic images used to define the MOSFET gate and/or source-drain channel length. Unfortunately, lithography is rapidly approaching fundamental physical limitations so that it becomes more and more difficult to consistently and uniformly define small images and device elements such as the gate and source-drain channel length.

More recently, MOSFETs have been developed in which the field induced conductive channel is no longer limited substantially to the plane of the semiconductor surface, but extends into other dimensions. Fin-type FETs and trench-FETs are examples of such non-planar FETs. However, these non-planar FETs have limitations and problems of their own and so there is an ongoing need for further device structures and methods wherein the gate length and induced source-drain channel lengths of the MOSFETs are not dependent on lithographic capabilities or limitations but can be determined by other means independent of such lithographic limitations and which can still be fabricated using available processing capabilities.

BRIEF SUMMARY OF THE INVENTION

Lithographic limitations on gate and induced channel length in MOSFETS are avoided by forming non-planar MOSFETS (20, 20', 80, 80') in cavities (50) extending into a semiconductor substrate (21). The gate insulator (26, 96) and channel region (29, 29') lie proximate a cavity sidewall (27). The cavity sidewall (27) has an angle $\alpha$ with respect to the semiconductor surface (212) where $\alpha$ is desirably at least about 90 degrees and may be as much as or more than about 95 degrees. The channel length (30) depends on the bottom depth (51) of the cavity and the depth (241, 641) from the surface (212) of a source or drain region (24, 64, 68) adjacent the sidewall (27) of the cavity (50). The corresponding drain or source (22, 62) lies at the cavity bottom (52). The cavity sidewall (27) extends therebetween. Neither depth is lithographically dependent. Very short channels can be consistently formed, providing improved performance and manufacturing yield. Source, drain and gate connections (44, 42, 48) are brought to the front surface (212) so that complex circuits can be readily constructed. The source and drain regions (22, 62 or 24, 64) are preferably formed epitaxially and strain inducing materials can be used therein to improve channel carrier mobility and reduce ON-resistance.

BRIEF DESCRIPTION OF THE DRAWINGS

The invention will be better understood from a reading of the following detailed description, taken in conjunction with the accompanying figures in the drawings in which like numerals denote like or analogous elements, and wherein.

DETAILED DESCRIPTION OF THE INVENTION

Figure 1:
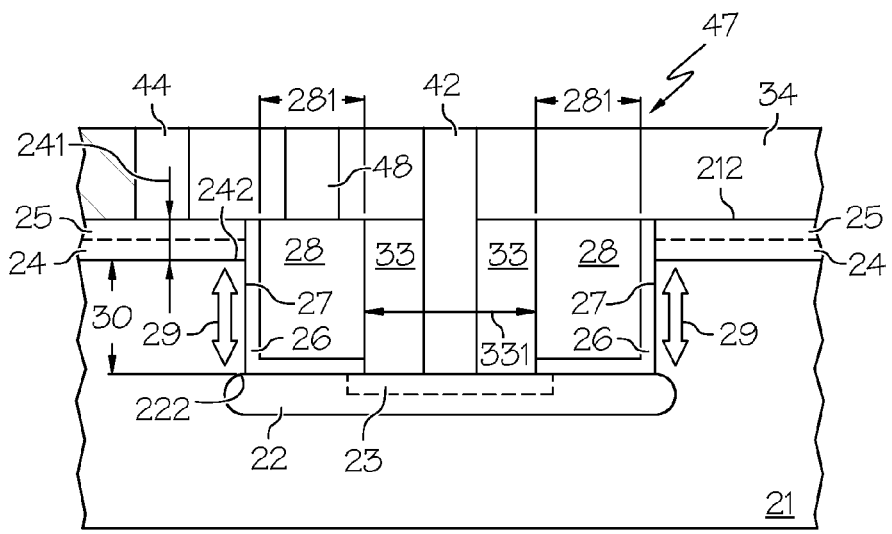
FIG. 1 shows a simplified cross-sectional view and FIG. 2 shows a simplified plan view of a MOSFET having a non-planar channel configuration, according to an embodiment of the invention.

The following detailed description is merely exemplary in nature and is not intended to limit the invention or the application and uses of the invention. Furthermore, there is no intention to be bound by any expressed or implied theory presented in the preceding technical field, background, or the following detailed description. For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent in such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. Furthermore, the terms "first," "second," "third," "fourth" and the like in the description and the claims, if any, may be used for distinguishing between somewhat similar elements and not necessarily for describing a particular spatial arrangement or sequence or chronological order. It is to be understood that the terms so used are interchangeable under appropriate circumstances such that the embodiments of the invention described herein are, for example, capable of operation or construction in sequences, orientations and arrangements other than those illustrated or otherwise described herein.

Metal-oxide-semiconductor (MOS) devices are a well known form of field effect transistors (FETs) and can be fabricated as either P-channel (PMOS) or N-channel (NMOS) devices. Complimentary metal-oxide-semiconductor (CMOS) devices include both PMOS and NMOS devices and are much used in integrated circuits (ICs). The term metal-oxide-semiconductor and the abbreviation (MOS) are widely used in the art to refer to insulated gate field effect transistors or devices (IGFETs) irrespective of whether they employ metals or some other form of conductor for the gates of such devices, and irrespective of whether they use oxide for the gate insulator or some other form of dielectric for the gate insulator. Doped semiconductors, metal-semiconductor alloys, semi-metals and combinations thereof are non-limiting examples of suitable gate conductors. Oxides, nitrides, fluorides, combinations thereof and other inorganic and organic dielectrics are non-limiting examples of suitable gate insulators. Accordingly, the term metal-oxide-semiconductor and the abbreviations MOS, MOSFET, PMOS, NMOS and CMOS as used herein are intended to refer broadly to such insulated gate field effect transistors or devices (IGFETs) and not be limited merely to those employing just metal as the gate conductor and/or just oxide as the gate insulator.

For convenience of explanation, embodiments of the invention are described herein for MOSFETs employing silicon semiconductors (SC). However, persons of skill in the art will understand that such embodiments are not limited merely to silicon (Si) semiconductors (SC), but also apply to other SC materials and other types of SC devices. Further, as used herein, the term "semiconductor", singular or plural, and the abbreviation "SC" therefore, are intended to include any kind of semiconductor material, including but not limited to single crystal semiconductors, polycrystalline semiconductors, amorphous semiconductors as well as organic and inorganic semiconductors. As used herein, the term "substrate", singular or plural, is intended to include bulk semiconductor substrates, insulating substrates, and combinations thereof such as but not intended to be limiting, semiconductor-on-insulator (SOI) substrates and insulator-on-semiconductor (IOS) substrates. Substrates may be single crystal, polycrystalline, amorphous, laminated or combinations thereof. For convenience of description, various conductors may be referred to as "metals", but unless indicated otherwise by the particular context, the words "metal" and "conductor", singular or plural, should be interpreted broadly to include any type of electrical conductor, whether metallic or not. Semiconductors, doped semiconductors, metals, semi-metals, metal alloys, semiconductor-metal alloys and combinations thereof are non-limiting examples of useful electrical conductors. The abbreviation "SC" is used herein for the terms "semiconductor" and "semiconductor material".

Figure 2:
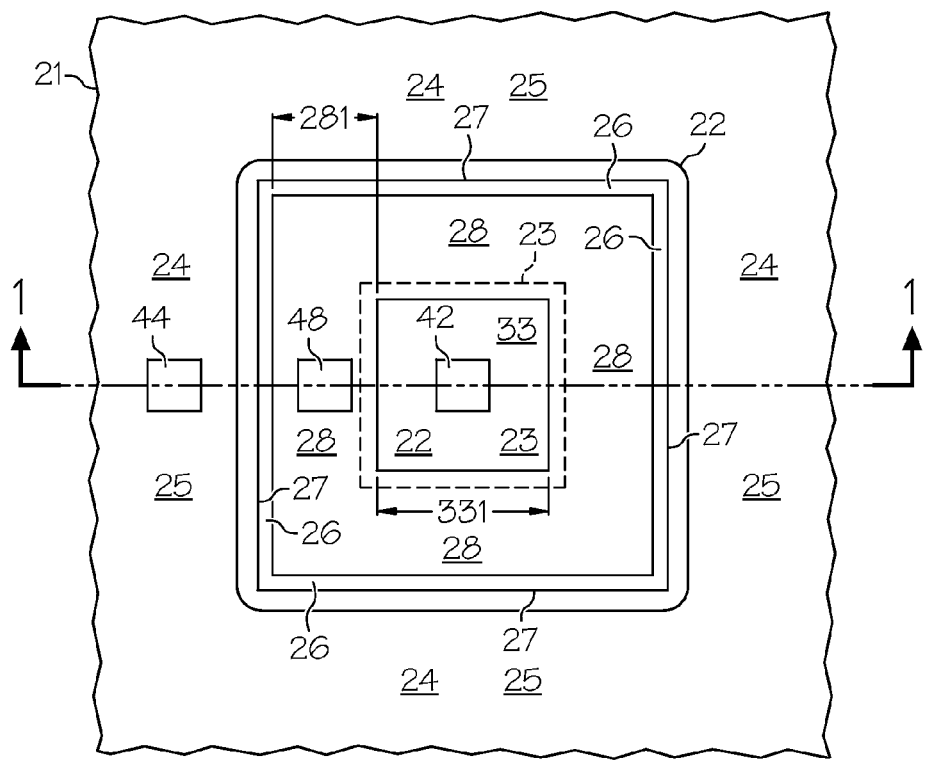

FIG. 1 shows a simplified cross-sectional view and FIG. 2 shows a simplified plan view of MOSFET 20 having a non-planar channel configuration, according to an embodiment of the invention. In FIG. 2 (and FIG. 3), overlying regions are assumed to be transparent so that their lateral extent and relative location may be easily seen. FIGS. 1 and 2 are discussed together. While MOSFET 20 is shown in the plan view of FIG. 2 as having an annular shape, this is merely intended to illustrate a preferred embodiment, and other non-annular arrangements may also be used and are intended to be included herein.

MOSFET 20 is formed in semiconductor (SC) substrate 21 of a first conductivity type, e.g., N or P, in which are located source and drain regions 22, 24 of a second, opposite conductivity type, e.g., P or N. Substrate 21 has upper or front surface 212. Persons of skill in the art will understand that either of regions 22, 24 may serve as the "source" of MOSFET 20 and the other serve as the "drain" of MOSFET 20, and while one region may be referred to herein as the "source" and the other as the "drain" at various times, this is not intended to imply that the particular region referred to must always be used for such purpose. Accordingly, while region 22 (and subsequently described region 62) may be referred to in some locations herein as acting as the source of MOSFET 20 and region 24 (and subsequently described region 64) may be referred to as acting as the drain of MOSFET 20, in other locations herein such designations may be interchanged so that region 22 (and region 62) is identified as the drain and region 24 (and region 64) as the source. This is indicative of the dual functionality of doped regions 22, 24 (and regions 62, 64 subsequently described) and the exact choice of function will depend upon the particular circuit being implemented by the user.

In MOSFET 20 of FIGS. 1-2, drain 24 with alloy contact region 25 lies substantially adjacent to surface 212 and source 22 with alloy contact region 23 is located beneath surface 212 within substrate 21. Source 22 and drain 24 are vertically separated by distance 30. Sidewall 27 of substrate 21 extends between source 22 and drain 24. Located on sidewall 27 is gate dielectric 26, one side of which is in contact with sidewall 27 and the other side of which is in contact with gate conductor 28. In plan view, gate conductor 28 of FIGS. 1-2 has a generally annular shape, that is, with an internal lateral opening of width 331 surrounded by annular gate conductor 28 of annular width 281. In the example of FIGS. 2, MOSFET 20 has an approximately rectangular shape, but this is not intended to be limiting, and other plan view shapes (e.g. and not intended to be limiting, polygonal, circular, elliptical, etc.) may also be used, and such annular shape, if used, need not be closed. The inversion channel length L (or stated another way, the "gate length" L) of MOSFET 20, corresponds substantially to distance 30.

When gate conductor 28 is appropriately biased, a conductive inversion channel indicated by arrow 29 forms between source (or drain) 22 and drain (or source) 24, more specifically between region 222 of source (or drain) 22 and region 242 of drain (or source) 24 proximate sidewall 27. For convenience, arrow 29 is also referred to herein as inversion channel 29, since it illustrates the primary current carrying path between doped region 22 (e.g., the source or drain) and doped region 24 (e.g., the drain or source) giving rise to the useful properties of MOSFET 20. The nature of the charge carriers (e.g., electrons or holes) and the direction of current flow in inversion channel 29 will depend upon whether MOSFET 20 is N or P type and the source-drain bias. Source 22 is desirably provided with metal-SC alloy contact region 23 and drain 24 is desirably provided with metal-SC alloy contact region 25, but other materials making Ohmic contact to source and/or drain regions 22, 24 may also be used. Silicides are non-limiting examples of suitable metal-SC alloy contact materials for silicon semiconductor. Contact regions 23, 25 are desirable but not essential. Dielectric region 33 conveniently overlies contact region 23 above source 22, extending substantially to surface 212. Interlayer dielectric 34 desirably overlies dielectric region 33 and surface 212 with drain (or source) contact region 25. Passing through interlayer dielectric 34 is: (i) drain (or source) connection 44 electrically coupled to drain (or source) contact region 25, and (ii) gate connection 48 electrically coupled to gate 28. Passing through interlayer dielectric 34 and dielectric region 33 is source (or drain) connection 42 electrically coupled to source (or drain) contact region 23. Further interlayer dielectric regions (not shown) and interconnections (not shown) may be used to couple connections 44, 48, 42 to other devices and power and ground leads.

Figure 11:
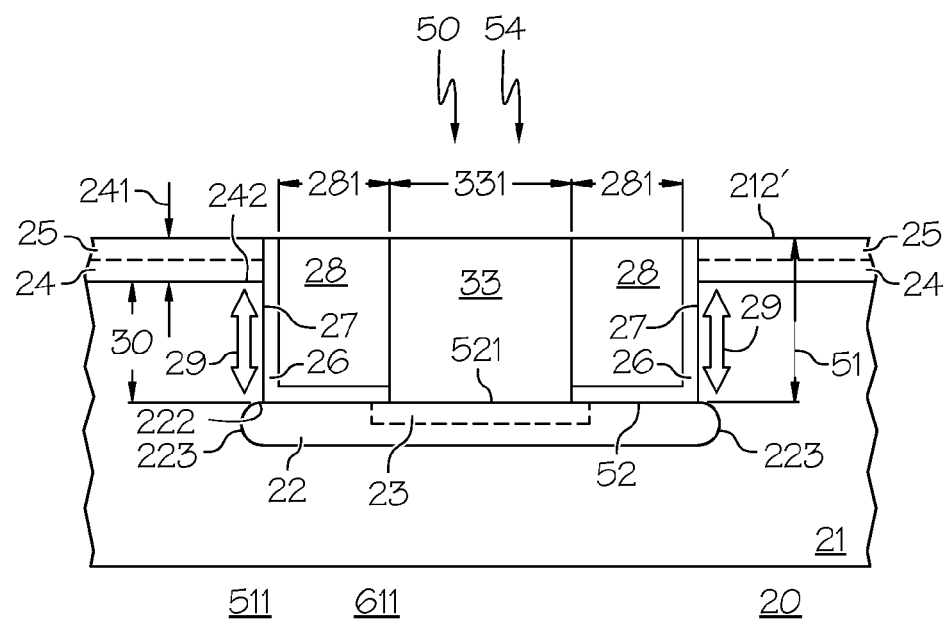
Figure 12:
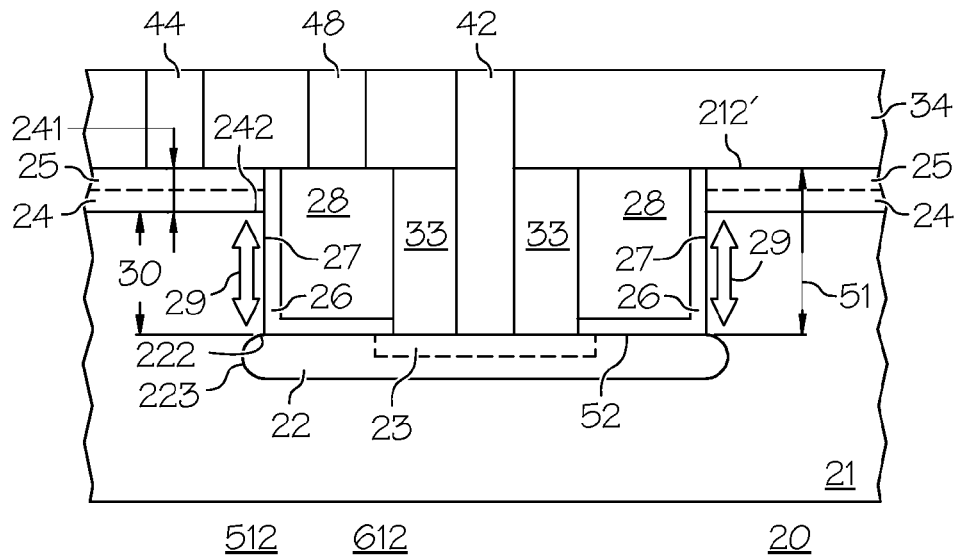
Figure 27:
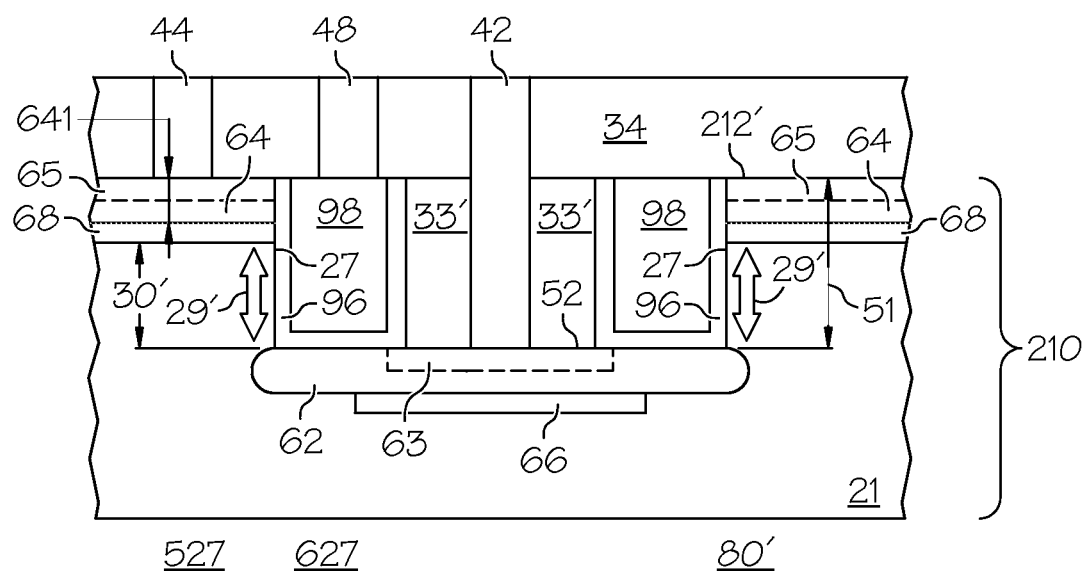

It will be noted that, unlike prior art trench-FETs, all three terminals, e.g., source, drain and gate connections 42, 44, 48, of MOSFET 20 are available on front surface 47 of MOSFET 20. In prior art planar MOSFETs the channel length is generally determined or related to the lithographically defined gate length that is substantially parallel to the principal surface of the semiconductor substrate in or on which the planar device is formed. The greater the lithographic limitations and lack of consistency, the greater the difficulties of accurately and consistently defining the channel length in planar MOSFETs. It will be noted that in MOSFET 20 of FIGS. 1-2, the inversion channel (e.g., gate) length L corresponds to depth or distance 30 and, unlike planar MOSFETS, is not dependent on lithographic capabilities or tolerances. As will be subsequently shown in connection with FIGS. 4-27, inversion channel or gate length 30 depends on depth 51 of etched cavity 50 (see FIGS. 4-5) in whose bottom 52 is formed doped (e.g., source) region 22, and depth 241', 241 (see FIGS. 5 and 11-12) to which doped (e.g., drain) region 24 extends beneath surface 212 of substrate 21. (In FIG. 27 channel length 30' also depends on the depth of further doped region 68.) Cavity etch depth 51 (see FIGS. 4-5) and depth 241', 241 (see FIGS. 5 and 11-12) of doped region 24 are relatively precisely controllable process parameters unrelated to lithographic definition and repeatability, thereby enabling one to consistently and accurately select and obtain predetermined distance 30 for inversion channel or gate length L of substantially vertical MOSFET 20 without being dependent upon lithographic capabilities or consistency. This is a significant advance in the art and highly desirable. Further, having source, drain and gate terminals 42, 44, 48 of MOSFET 20 available on front surface 47 of MOSFET 20 makes it possible to form large, complex and dense integrated circuits (ICs) using available processing technology. This is a very valuable capability of great commercial significance.

Figure 3:
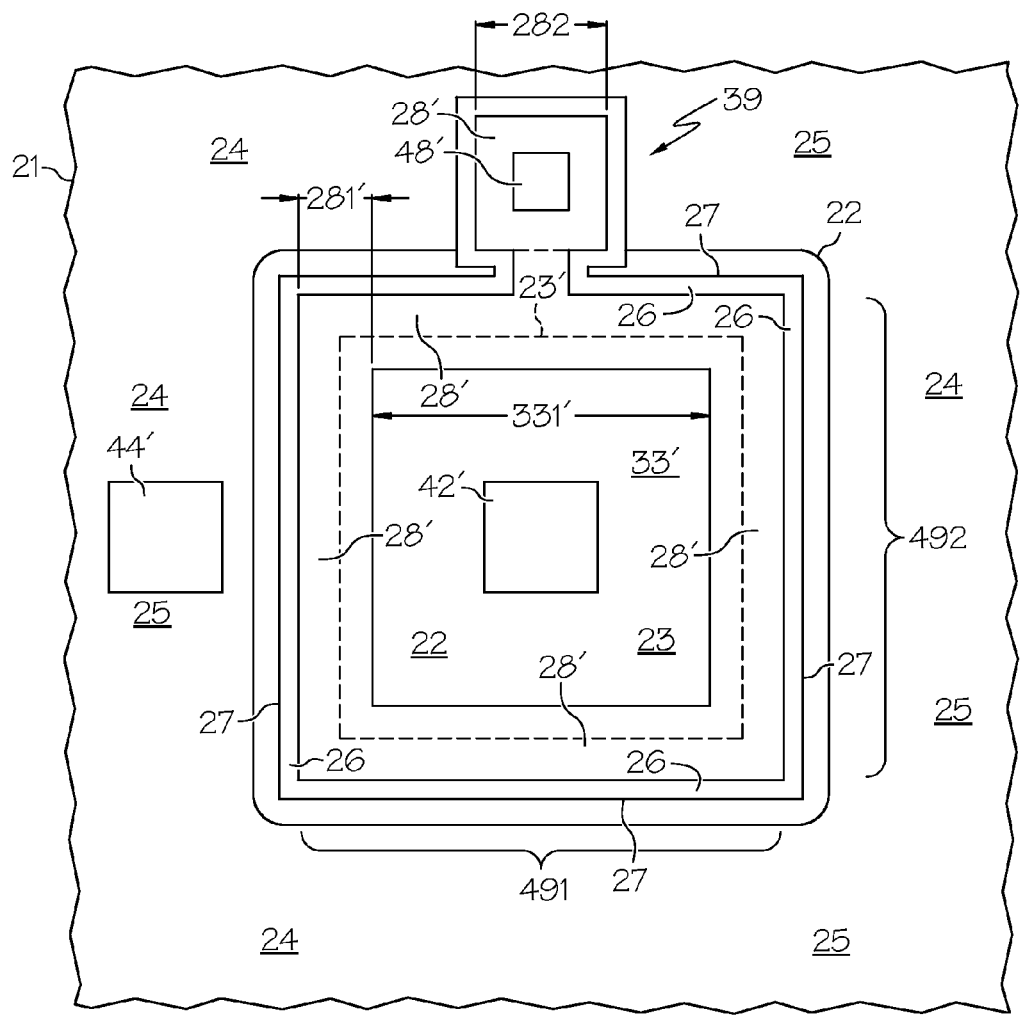
FIG. 3 shows a simplified plan view of a MOSFET analogous to that of FIG. 2, but according to another embodiment of the invention.

FIG. 3 shows a simplified plan view of MOSFET 20' analogous to that of MOSFET 20 of FIG. 2, but according to another embodiment of the invention. MOSFET 20' has source-drain regions 22, 24, contact regions 23, 25, gate conductor 28', sidewall 27, central dielectric region 33' and connections 42', 44', 48' that are analogous to regions 22, 23, 24, 25, 28, 27, 33, 42, 44, 48 of FIGS. 1-2 but with somewhat different plan view shapes. MOSFET 20' of FIG. 3 differs from MOSFET 20 of FIG. 2 in that extension 39 of gate region 28' is provided, for example on one side of MOSFET 20', to allow gate connection 48' to be provided laterally outside plan view annular footprint 491-492 of gate 28'. Lateral width 282 of gate extension 39 of MOSFET 20' of FIG. 3 may be made wider than annular gate width 281 of device 20 of FIG. 2. This facilitates lithographic placement of gate connection 48', thereby improving manufacturing yield. Further, lateral annular width 281' of gate 28' may be made smaller, thereby reducing the overlap capacitance between gate 28' and source (or drain) region 22, thereby improving device performance in certain circumstances. In addition, for substantially similar outer perimeter of gate 28', reducing annular gate width 281' increases width 331' of central dielectric region 33' through which connection 42' to source (or drain) contact region 23 conveniently passes. Source (or drain) connection 42' may now be made larger, as can drain (or source) connection 44' that lies laterally outside of gate 28'. This reduces the series source-drain connection ON resistance and increases the drive current capability of the device 20'. These desirable advantages are realized in MOSFET 20' of FIG. 3 by placing gate connection 48' laterally outside of substantially annular gate footprint 491-492.

FIGS. 4-12 show simplified cross-sectional views of MOSFET 20 of FIG. 1-2 during various stages 504-512 of manufacture, according to further embodiments of the invention. Persons of skill in the art will understand that these same manufacturing stages also substantially apply to MOSFET 20' of FIG. 3 taking into account the differences in lateral sizes and locations of the various regions being formed. FIG. 4-12 are intended to illustrate by way of example and not limitation, a basic manufacturing process for forming device 20, 20' of FIGS. 1-3, but persons of skill in the art will understand that many variations are possible, which variations are intended to be included.

Figure 4:
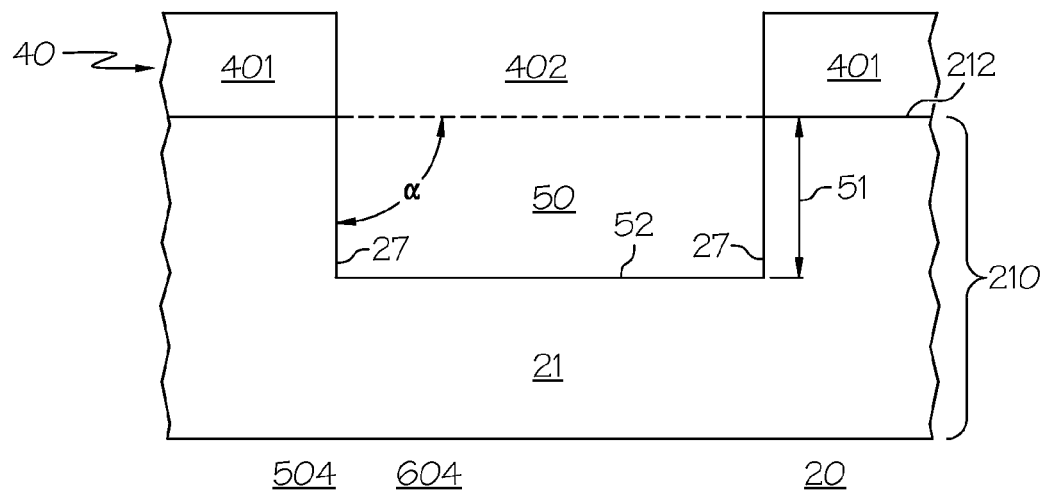
FIGS. 4-12 show simplified cross-sectional views of the MOSFET of FIGS. 1-2 (and 3) during various stages of manufacture, according to further embodiments of the invention.

Referring now to manufacturing stage 504 of FIG. 4, substrate 21 is provided having thickness 210 and upper surface 212. Substrate 21 may be monolithic or layered and amorphous or single crystal or combinations thereof, provided that sidewall 27 of substrate 21 includes a semiconductor in which induced channel 29 of FIGS. 1, 12 and 18 and channel 29' of FIG. 27 may be formed. By way of example and not intended to be limiting, for an NMOS device, substrate 21 adjacent or around sidewall 27 is conveniently P-type with a doping density in the range of about 10E16 to 10E18 cm$^{-3}$, and for a PMOS device, substrate 21 adjacent or around sidewall 27 is conveniently N-type with a doping density in the range of about 10E16 to 10E18 cm$^{-3}$, but other substrates and doping densities may also be used. Thickness 210 will depend primarily on the lateral size of substrate 21 and the choice thereof is within the competence of those of skill in the art. Mask 40 having closed portions 401 and open portion 402 is provided on surface 212.

Cavity 50 having sidewall 27 and bottom 52 at depth 51 from surface 212 is etched or otherwise excavated into substrate 21 beneath open portion 402 of mask 40. Cavity 50 is preferably created using reactive-ion-etching (RIE). RIE conveniently provides sufficient etch anisotropy to form the illustrated cavity profile with angle $\alpha$ desirably in the range of about 90-95 degrees, preferably about 90 degrees. Cavity depth 51 can be controlled during etching by an optical intereferometrical measurement. This is a well known technique in the RIE art. By way of example and not intended to be limiting, depth 51 is usefully in the range of about 10 to 50 nanometers, but larger or smaller depths may also be used. Structure 604 results. The lateral perimeter of cavity 50 in plan view substantially determines the perimeter of gate 28 of device 20 and can be selected by those of skill in the art depending upon the desired device properties. In the context of standard planar MOSFET terminology, the outer lateral perimeter of cavity 50 corresponds approximately to the gate or channel "width" as that term is used for planar MOSFETs.

Sidewall 27, adjacent to which conductive channel 29 (see FIG. 1) will be induced during operation of device 20, makes angle $\alpha$ with surface 212 of substrate 21. While the various embodiments illustrated here are shown as having substantially vertical sidewalls 27, that is with $\alpha \sim 90$ degrees and proceeding relatively straight toward bottom 52, this is merely intended to illustrate a preferred embodiment and not intended to be limiting. Accordingly, as used herein, the term "non-planar" with respect to MOSFETs is intended to include any device wherein angle $\alpha$ is equal to or greater than about 90 degrees. Sidewall 27 may be curved or substantially straight. Having angle $\alpha \geq 90$ degrees is useful in avoiding undesired doping of sidewall 27 during manufacturing stage 505 of FIG. 5.

Figure 5:
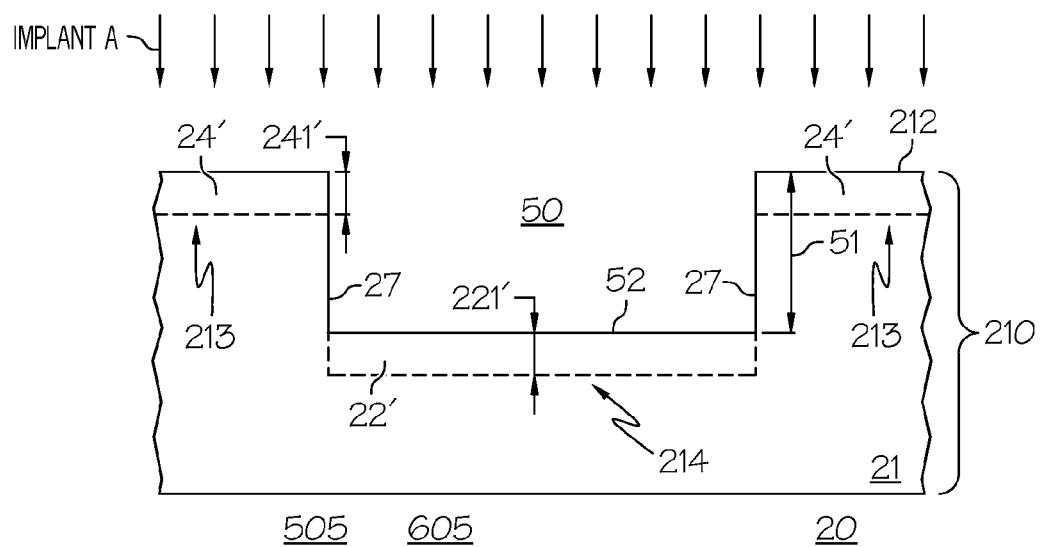

Referring now to manufacturing stage 505 of FIG. 5, mask 40 is removed and Implant A provided wherein dopant of the desired type and dose is implanted to depth 241' into portions 213 of substrate 21 laterally outside of cavity 50 to form doped region 24', and to depth 221' in portion 214 of substrate 21 beneath bottom surface 52 of cavity 50 to form doped region 22'. Doped region 24' is the precursor to doped region 24 and doped region 22' is the precursor to doped region 22 of FIGS. 1-3. Initial depth 241' of initial doped region 24' is the precursor to final depth 241 of final region 24 of FIGS. 1 and 12. It will be understood by those of skill in the art that some out-diffusion of the impurities of initial regions 22', 24' will occur as a result of the various thermal processes to which device 20 is subjected during subsequent manufacturing stages. Persons of skill in the art will understand how to take such out-diffusion into account in selecting initial doping depth 241' in order to reach a predetermined final doping depth 241 in the finished device illustrated in FIGS. 1 and 12. Ordinarily, depths 241' and 221' are substantially the same but this is not essential and in other embodiments, different doping depths 241', 221' (and 241, 221) may be used. While ion implantation is a preferred means of forming initial doped regions 22', 24' (and resulting doped regions 22, 24), it is indicated by way of a preferred example and not limitation and other doping procedures well known in the art may also be employed. The implant dose and energy associated with Implant A should be chosen so as to provide the desired doping density and depth of regions 22', 24' and 22, 24 that serve as the source-drain (or drain-source) regions of device 20. This is within the competence of those of skill in the art, but in general the doping density is desirably about $10^1$ to $10^3$ time the doping density of substrate 21 proximate sidewall 27, but higher or lower doping densities may also be used. Structure 605 results. If undesired doping of sidewall 27 has occurred during manufacturing stage 505, then a brief isotropic etch may be used to remove such undesired doping from sidewall 27.

Figure 6:
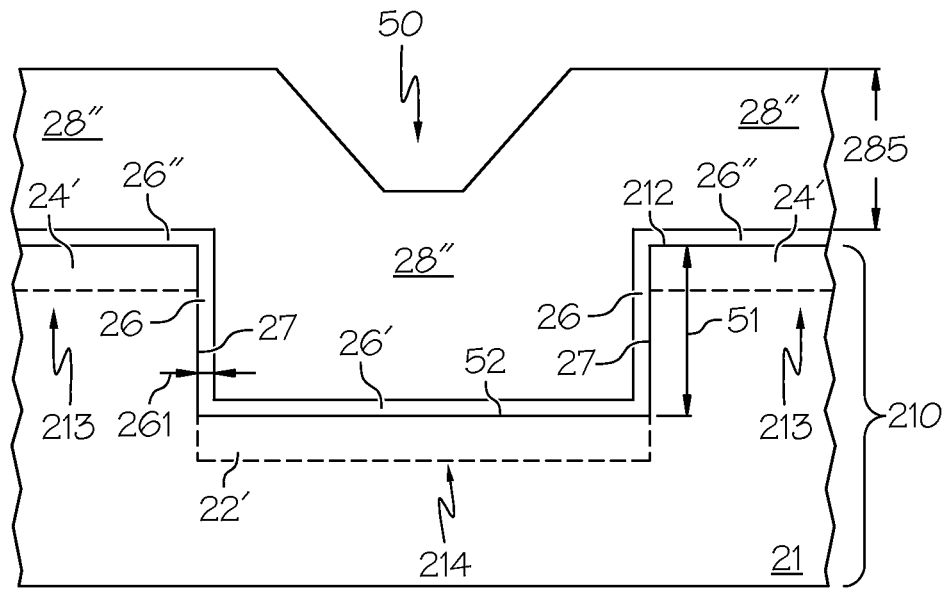

Referring now to manufacturing stage 506 of FIG. 6, at least surfaces 27 and 52 are provided with dielectric layer 26', of which portion 26 of thickness 261 on sidewall surfaces 27 can, in this example, subsequently serve as the gate dielectric or gate insulator, and portion 26" of dielectric layer 26' conveniently but not essentially extends over surface 212 of substrate 21. $SiO_2$, SiON, $HFO_2$, $HFSiO_2$, $ZrO_2$ and combination thereof are non-limiting example of useful materials for dielectric layer 26', but other inorganic or organic insulators may also be used. Conductor layer 28" of thickness 285 is provided over substrate 21 and over dielectric layer portions 26, 26', 26" and extending into cavity 50. Conductor layer 28" is conveniently of in-situ doped poly silicon or titanium-nitride (TiN), but other conductors such as those that have been described above may also be used. TiN is preferred. Thickness 285 is desirably at least equal to depth 51 of cavity 50, but other depths may also be used. Structure 606 results.

Figure 7:
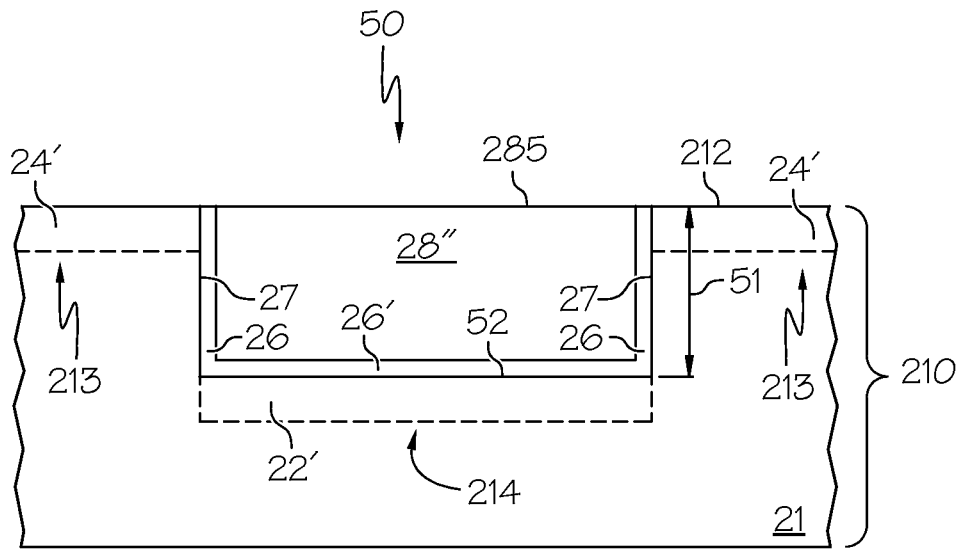

Referring now to manufacturing stage 507 of FIG. 7, structure 606 is desirably planarized using means well known in the art, such as for example and not intended to be limiting, chemical-mechanical polishing (CMP). CMP for planarization of conductor layers is well known in the art. Planarization is conveniently stopped at surface 212 of substrate 21. Structure 607 results in which upper surface 285 of conductor 28" is substantially coplanar with surface 212 of substrate 21.

Figure 8:
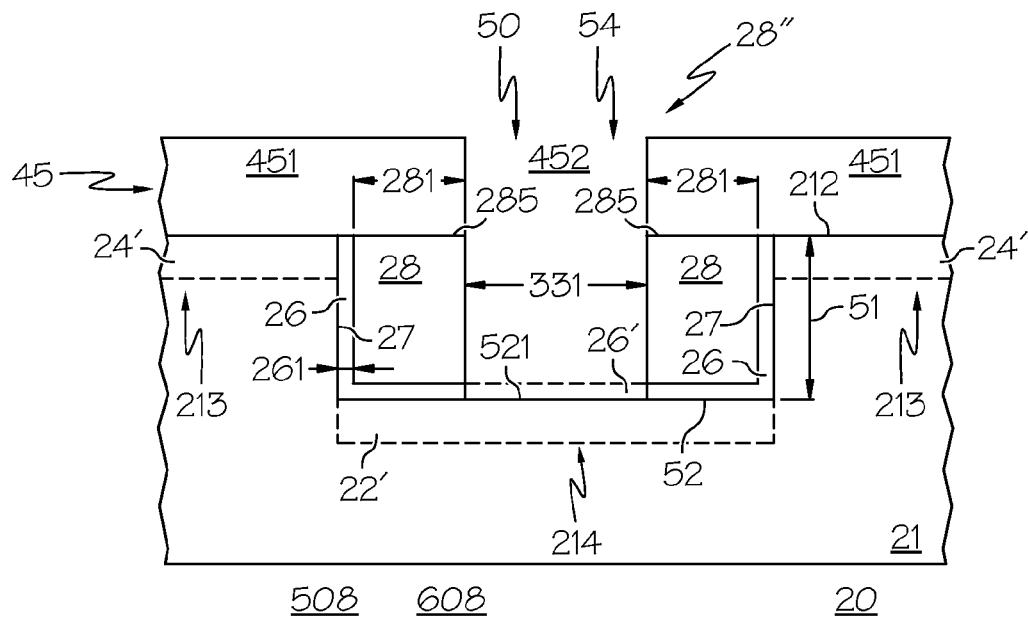

Referring now to manufacturing stage 508 of FIG. 8, mask 45 having closed portions 451 and open potion 452 is provided above surfaces 212 and 285. The portion of conductor 28" (see FIG. 7) exposed through open portion 452 is etched away, thereby providing approximately centrally located cavity 54 of width 331 in conductor 28" substantially laterally surrounded by gate conductor 28 of lateral width 281. Cavity 54 extends to dielectric region 26' on bottom 52 of cavity 50. That portion of dielectric region 26' underlying cavity 54 is desirably then removed by means of a brief dielectric etch, thereby exposing surface portion 521 of bottom surface 52 of cavity 50 underlying cavity 54. Structure 608 results. While that portion of dielectric layer 26' underlying cavity 54 is conveniently removed at this stage as noted above, that is not essential and it may be removed as a part of subsequent manufacturing stage 509. Either arrangement is useful.

Figure 9:
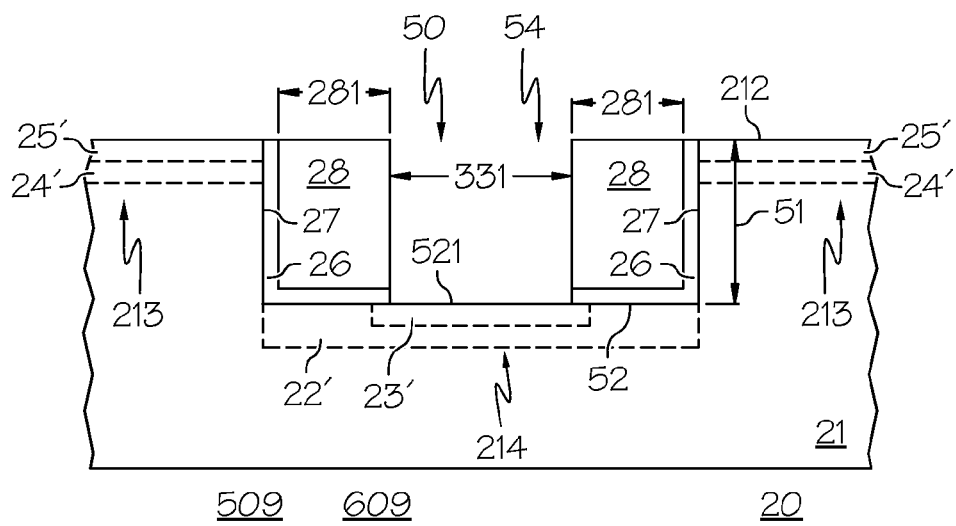

Referring now to manufacturing stage 509 of FIG. 9, mask 45 of structure 608 is removed. Surface 212 of portions 213 of substrate 21 and portion 214 of substrate 21 underlying bottom surface portion 521 under cavity 54, are exposed to a metal adapted to form metal-SC alloy contact region 23' in source (or drain) region 22' and metal-SC alloy contact region 25' in drain (or source) region 24'. Where substrate is of silicon, then Nickel and Cobalt are non-limiting examples of suitable metals for forming metal-SC alloy contact regions 23', 25', where Nickel is preferred. By way of example and not limitation, in a preferred embodiment, nickel material is blanket sputtered on structure 608 to about 10 to 15 nm thickness, but thicker and thinner layers may also be used. A brief rapid-thermal-anneal (RTA) is performed at about 280-350 degrees Celsius for about 30 seconds, but other temperatures and times may also be used. This results in formation of nickel-silicide only where the sputtered nickel overlies silicon. This if referred to as a self-aligned silicide, often abbreviated as "salicide". A brief wet etch is used to remove any un-reacted nickel, leaving behind the metal-semiconductor (e.g., NiSi) alloy contacts. A further slightly higher temperature RTA (e.g., at 400-480 degrees Celsius for about 30 seconds) is desirably but not essentially applied to adjust the grain size of the NiSi alloy contacts. In this way the metal used to form metal-SC alloy contact regions 23', 25' does not significantly deposit on the narrow ends of gate dielectric 26 laterally surrounding gate conductor 28 between gate conductor 28 and doped region 24' at surface 212 and in cavity 54 between the bottom of gate 28 and doped region 22'. This is useful since it avoids or minimizes gate-drain and gate-source shorts across the exposed narrow ends of gate dielectric 26 adjacent gate conductor 28. Where substrate 21 is of silicon, gate 28 is of TiN and metal-SC alloy contact is of nickel-silicide, then a sulfuric acid hydrogen peroxide mixture is a non-limiting example of a suitable etch for clearing gate-source and gate-drain shorts that may be associated with these narrow gate dielectric edges as a result of alloy contact formation, but other etchants may also be used depending upon the particular combination of gate and alloy contact conductors chosen by the user. Annealing to facilitate the formation of the metal-SC alloy contacts 23', 25' (and subsequently 23, 25) may be carried out separately as described above or may be combined with temperature cycles associated with dielectric depositions described later, which promote the formation of the metal-SC alloy and the out-diffusion of the dopants of initial regions 22', 24' as mentioned earlier. In recognition thereof, the boundaries of regions 24, 25' are still shown as dashed lines in FIG. 9. Structure 609 results.

Figure 10:
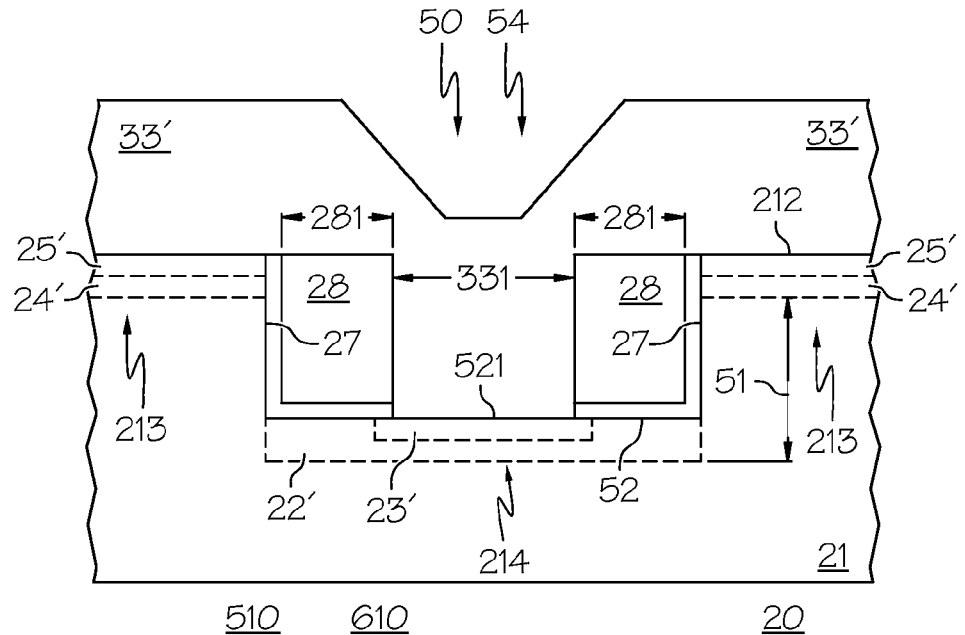

Referring now to manufacturing stage 510 of FIG. 10, dielectric layer 33' of, for example and not intended to be limiting, $SiO_2$ (e.g., made using TEOS) is formed over structure 609, preferably but not essentially to a thickness at least about equal to cavity depth 51. Structure 610 results. Referring now to manufacturing stage 611 of FIG. 11, structure 610 is desirably planarized, e.g., using CMP, leaving behind central dielectric region 33 within substantially annular gate 28, covering doped region (e.g., source or drain) 22 with metal-SC alloy contact region 23' on bottom portion 521 and extending desirably to surface 212 of substrate 21. CMP for planarization of dielectric regions is well known in the art. In recognition of the various annealing or other thermal processing associated with these and preceding operations, doped regions 22 and 24 are shown as solid lines in FIG. 11 indicating that such out-diffusions as may occur has substantially been completed so that region 24 has substantially reached its final depth 241 from surface 212, and in combination with depth 51 of cavity 50 thereby defined induced channel length 30. The boundaries between metal-SC alloy contact region 23 and source (or drain) region 22 and between metal-SC alloy contact region 25 and drain (or source) region 24 are left as dashed lines, since their precise locations within doped regions 22, 24 are not critical. Persons of skill in the art will understand that any significant thermal processing associated with formation of any subsequent interlayer dielectrics and conductive interconnections are either not significant or can be taken into account as part of the overall thermal budget that may affect induced channel length 30. Such thermal budget and out-diffusion calculations are within the competence of persons of skill in the art. Structure 611 results.

It is desirable but not essential that lateral end 223 of doped region 22 extend laterally (e.g., to the left and right) to or beyond sidewall 27 so that induced channel current 29 flows substantially parallel to sidewall 27 between portions 222 and 242 of regions 22 and 24. To the extent that region 22 does not extend laterally to or beyond sidewall 27 (as for example if end 223 is partially recessed beneath gate 28), then induced channel current 29 will initially flow substantially horizontally until it reaches the lateral location of sidewall 27 and then turn upward to flow substantially parallel to sidewall 27 to doped region 24. Either arrangement is useful, but having end 223 of doped region 22 extend laterally to or beyond sidewall 27 is preferred. FIGS. 1-12 have shown sidewall 27 as being substantially vertical and perpendicular to surface 212 of substrate 21 but, as discussed above, this is not essential and sidewall 27 does not have to be straight and smooth as has been illustrated. Either arrangement is useful.

Structure 611 may be used as is or provided with further overlying dielectric layers and electrical contacts or interconnections, as is common in the art. Referring now to manufacturing stage 512, structure 611 has dielectric layer 34 formed thereon, vias corresponding to the desired locations of electrical connections 42, 48, 44 provided therein (and through dielectric region 33 in the case of conductor 42), which are then filled with electrical conductors to form electrical connections to doped (source or drain) region 22, gate 28 and doped (drain or source) region 24, respectively. Structure 612 results. Further dielectric layers and interconnections may also be provided depending upon the particular device structure or integrated circuit being formed.

FIGS. 13-18 show simplified cross-sectional views of MOSFET 80 of FIGS. 1-2 during various stages of manufacture 513-518, according to still further embodiments of the invention. Persons of skill in the art will understand that these same manufacturing stages apply to the structure shown in FIG. 3 taking into account the differences in lateral sizes and locations of the various regions being formed. Referring now to manufacturing stage 513 of FIG. 13, structure 406 of FIG. 4 has dielectric layer 60 of thickness 701 formed on surfaces 212, 27 and 52, as for example by deposition or growth of $SiO_2$ or other dielectric using means well known in the art. Silicon oxide is a non-limiting example of a suitable dielectric material for layer 60, but other materials may also be used. In a preferred embodiment, thickness 701 of layer 60 is desirably in the range of about 1 to 3 nanometers, but thicker or thinner layers may also be used. Overlying layer 60 is layer 61' of thickness 702, of for example and not intended to be limiting, silicon nitride, but other materials may also be used. Thickness 702 is desirably in the range of about 3 to 8 nanometers, but thicker or thinner layers may also be used. It is desirable but not essential that the material of layer 61' be differentially etchable with respect to the material of layer 60. Structure 613 results.

Figure 13:
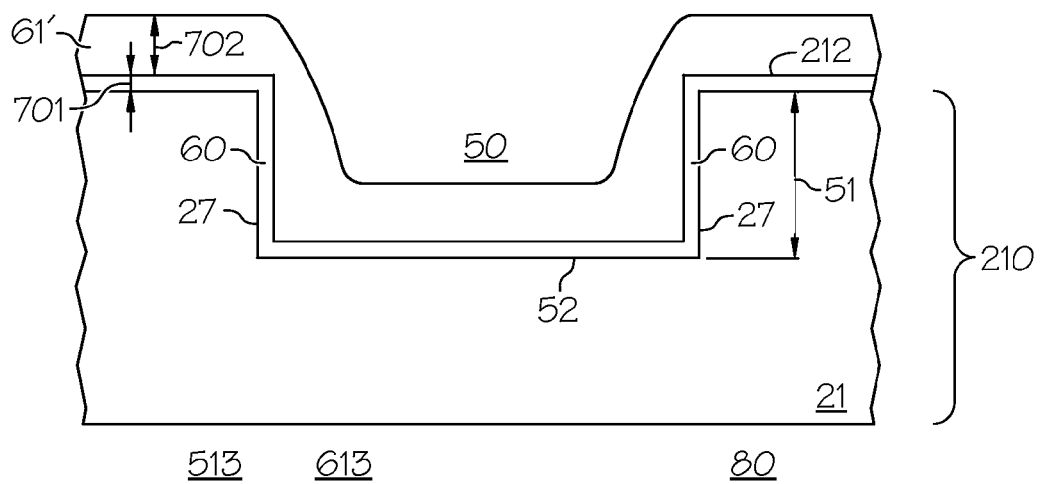
FIGS. 13-18 show simplified cross-sectional views of the MOSFET of FIGS. 1-2 (and 3) during various stages of manufacture, according to still further embodiments of the invention.
Figure 14:
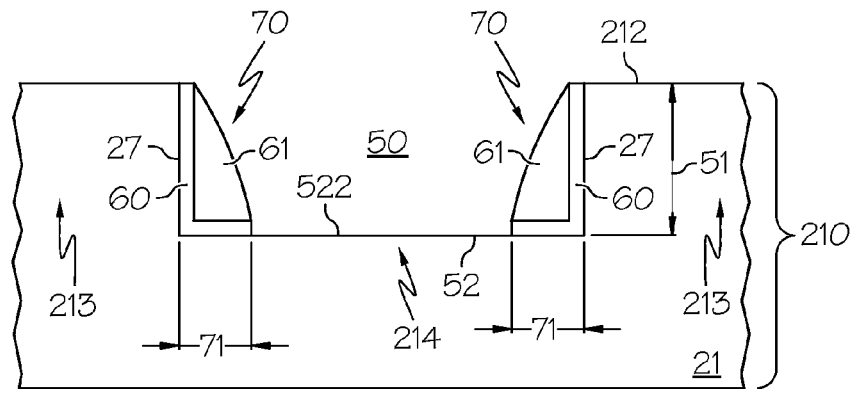

Referring now to manufacturing stage 514 of FIG. 14, structure 613 of FIG. 13 is anisotropically etched to remove layers 61' and 60 except on sidewall 27 of cavity 50, leaving behind that portion of layer 60 on sidewall 27 covered in turn by portion 61 of the material of layer 61', collectively referred to as sidewall protector 70 having lateral width 71 on bottom 52 of cavity 50. While sidewall protector 70 is conveniently of two materials as described above, it may also be formed from any material of combination of materials that is substantially differentially etchable with respect to the material of substrate 21 and substantially resistant to reagents that etch the material of substrate 21. Either arrangement is useful. Procedures for forming such sidewall protectors are well known in the art. Surface 212 of substrate 21 and portion 522 of bottom 52 of trench 50 laterally within sidewall protector 70 are exposed. Structure 614 results.

Figure 15:
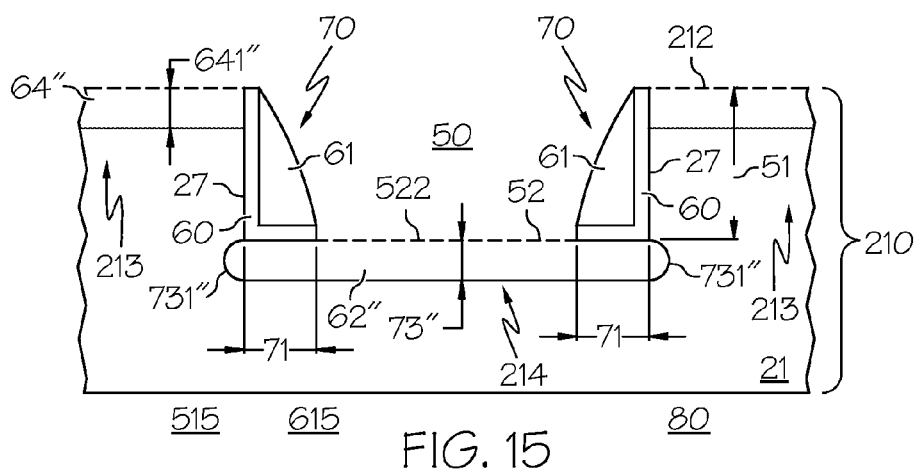

Referring now to manufacturing stage 515 of FIG. 15, structure 614 of FIG. 14 is subjected to an isotropic semiconductor etch adapted to remove those portions of substrate 21 in locations 213, 214 not covered by sidewall protector 70 of manufacturing stage 514. In this manner portion 64" of substrate 21 beneath surface 212 in location 213 and portion 62" of substrate 21 beneath exposed portion 522 of bottom 52 of cavity 50 in location 214 are removed. Wet chemical etching is a non-limiting example of a suitable isotropic etch procedure for forming cavities 64", 62". By controlling lateral thickness 71 of sidewall protector 70 and use of an isotropic etch of at least depth 73" into substrate 21, lateral end portion 731" of cavity 62" can extend laterally to or beyond sidewall 27. In a preferred embodiment, depth 73" is desirably at least equal to lateral thickness 71 of sidewall protector 70. Structure 615 results.

Figure 16:
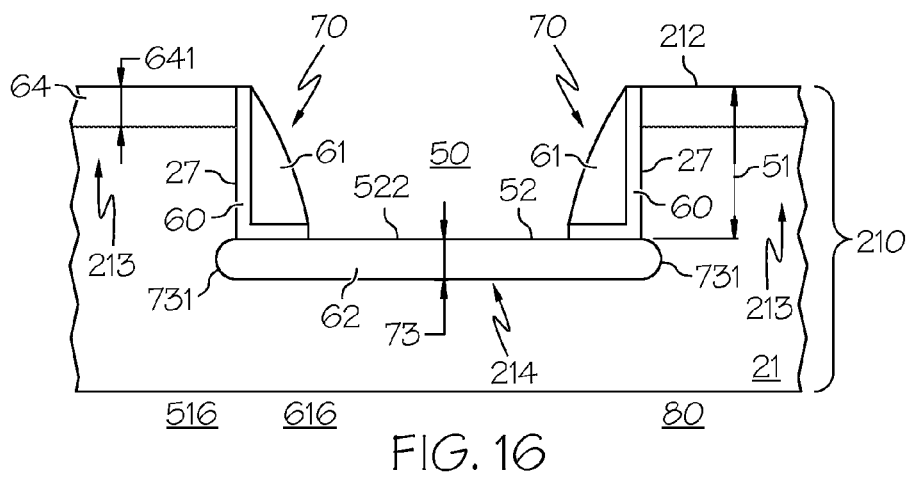

Referring now to manufacturing stage 516 of FIG. 16, structure 615 is preferably subject to in-situ doped selective epitaxial growth of semiconductor to fill in cavity 64" in location 213 and cavity 62" in location 214, thereby creating doped SC region 64 of thickness 641 adjacent upper surface 212 in location 213, and doped SC region 62 adjacent surface 52 in location 214 having end portion 731 extending laterally to or beyond sidewall 27. Where substrate 21 is of silicon, epitaxial growth of doped regions 64, 62 is conveniently carried out by low pressure chemical vapor deposition (LPCVD), but other well known epitaxial growth techniques may also be used. Regions 64, 62 are conveniently doped to impurity concentrations in the range of about 1E19 to 5E20 $cm^{-3}$, but higher and lower impurity concentrations can also be used. Boron is non-limiting example of suitable impurity for PMOS devices and phosphorous and Arsenic and combinations thereof are non-limiting example of suitable impurities for NMOS devices, but other impurities may also be used. Doping of epi-regions 62, 64 may be carried out during epitaxial growth or later. Either arrangement is useful. Doped region 64 of thickness or depth 641 are analogous in function to doped region 24 of thickness or depth 241 of FIGS. 1-3 and doped region 62 is analogous in function to doped region 22 of FIGS. 1-3. Structure 616 results.

Figure 17:
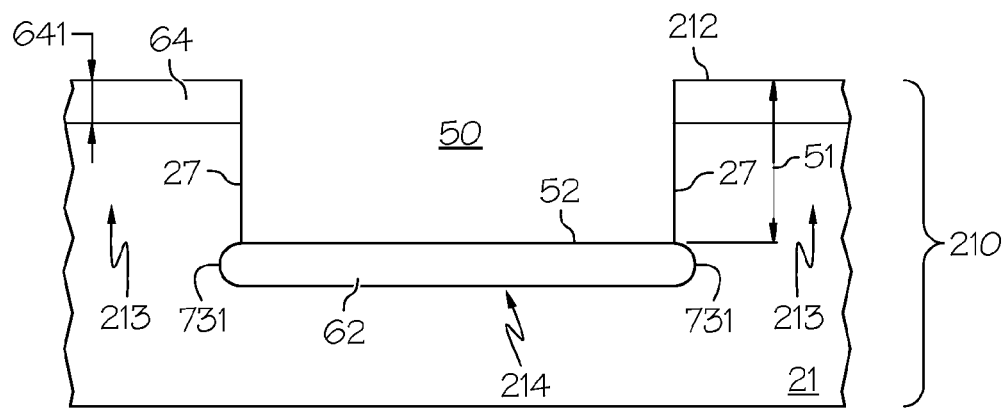

Referring now to manufacturing stage 517 of FIG. 17, sidewall protector 70 is removed. Structure 617 results. With respect to subsequent manufacturing stages, other than out-diffusion effects that can be more significant in the manufacturing sequence illustrated by FIGS. 4-13, structure 617 of FIG. 17 is substantially equivalent to structure 605 of FIG. 5. That is, cavity 50 has been formed in substrate 21 and the impurities leading to doped regions 24, 64 and 22, 62 have been provided in the desire relationship to sidewall 27. In the manufacturing sequence of FIGS. 4-13, regions 22, 24 are provided by direct doping of substrate 21 (e.g., by ion implantation), and in the manufacturing sequence of FIGS. 14-18 analogous regions 62, 64 are provided by excavation of substrate 21 and epitaxial re-growth (with concurrent or subsequent doping) in substantially the same locations relative to sidewall 27.

Figure 18:
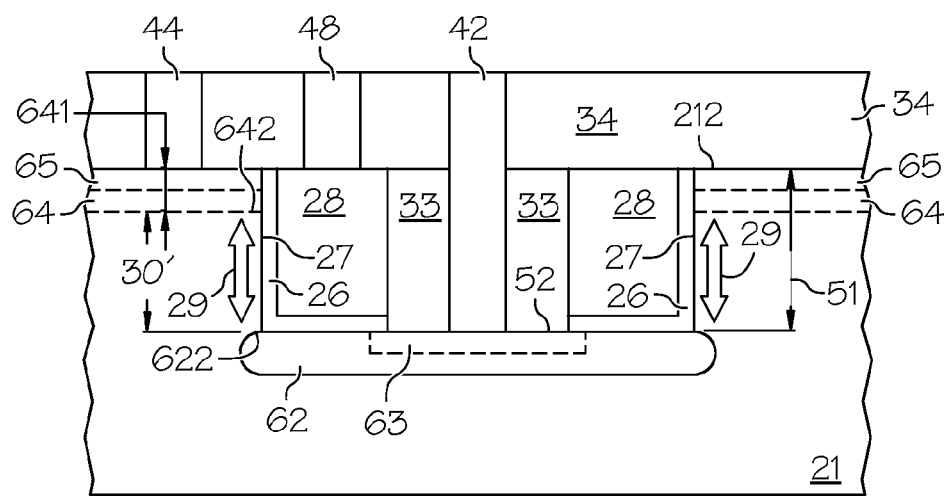
Figure 19:
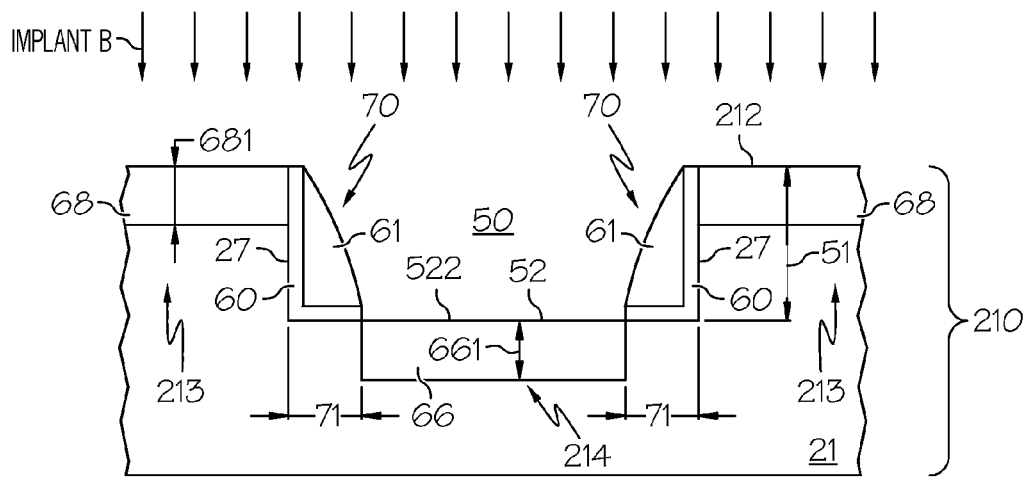
FIGS. 19-27 show simplified cross-sectional views of the MOSFET of FIGS. 1-2 (and 3) during various stages of manufacture, according to still yet further embodiments of the invention.

Referring now to manufacturing stage 518 of FIG. 18, persons of skill in the art will understand that manufacturing stage 518 of FIG. 18 includes the equivalent of manufacturing stages 506-513 wherein gate dielectric region 26, gate conductor 28, central dielectric region 33, metal-SC alloy contact region 63 (equivalent to region 23), metal-SC alloy contact region 65 (equivalent to region 25), interlayer dielectric 34 and connection 44, 48, and 42 are provided. Accordingly, the discussion of such manufacturing stages is incorporated here by reference. Structure 618 results wherein channel length 30 is determined substantially by the combination of cavity etch depth 51 and depth 641 of epi region 64 (analogous to depth 241 of doped region 24). When gate 28 is appropriately biased, induced channel 29 forms between portion 622 of doped region 62 and portion 642 of doped region 64.

Manufacturing sequence 514-518 and structure 618 have several advantages relative to manufacturing sequence 504-513 and structure 613. First the use of epitaxial growth for forming doped regions 64, 62 permits more abrupt junctions to be formed as compared to doped region 24, 22. This is useful in optimizing device design under certain circumstances. Second, doped regions 64, 62 may be formed of other materials than merely the material of substrate 21. For example, when substrate 21 is of silicon, rather than forming doped regions 64, 62 of epitaxial silicon, in other embodiments such regions may be formed from strain inducing semiconductor materials, i.e., SC materials having different lattice constants than substrate 21. Non-limiting examples of suitable strain inducing materials for use with silicon substrates are SiGe for use in PMOS devices and/or SiC for use in NMOS devices. Other strain inducing materials may also be used. The germanium concentration in SiGe can be varied from 20% to 50% and the carbon concentration in SiC can be varied from 1% to 3% or more, but other concentrations may also be used. When regions 64, 62 are formed from such materials, strain is induced in the region where conductive channel 29 is induced during operation of device 80. Such strain is known to increase carrier mobility, thereby reducing the ON-resistance of the device having the strained channel region. This permits non-planar devices of further improved properties to be provided and is a significant advantage.

FIGS. 19-27 show simplified cross-sectional views of MOSFET 80' of FIGS. 1-2 during various stages 519-527 of manufacture, according to still yet further embodiments of the invention. Persons of skill in the art will understand that these same manufacturing stages apply to the structure shown in FIG. 3 taking into account the differences in lateral sizes and locations of the various regions being formed. Referring now to manufacturing stage 519 of FIG. 19, manufacturing stage 519 follows from structure 614 of FIG. 14, and the discussion thereof is incorporated herein by reference. Manufacturing stage 519 is desirable but not essential. In manufacturing stage 519, Implant B is applied to form doped region 68 of depth 681. For convenience of processing, doped region 66 of depth 661 is formed at the same time, but is not essential and does no harm. In other embodiments, it may be omitted. In general, implant B is provided so that depth 681 is greater than depth 641 of subsequently formed doped region 64 (e.g., see FIG. 18 or 27). Its purpose is to provide a more graded junction than might otherwise be obtained merely with doped region 64 alone. This is useful in optimizing the electrical properties of resulting MOSFET 80'. The energy of Implant B should be adjusted so that depth 681 is approximately about 20 percent greater than depth 641 of subsequently formed doped region 64. Implant B is of the same conductivity type (and generally similar dopants) as the doping of region 64 and desirably has a doping concentration in the range of about 2E18 to 1E19 cm$^{-3}$, but higher and lower concentrations may also be used. Stated another way, the doping of region 68 beneath region 64 is desirably of lower concentration than the doping of region 64 by a factor of about 10 to 20, but other doping ratios may also be used. For manufacturing convenience, region 68 is shown in FIGS. 19-28 as having the same lateral extent as doped region 64, but this is not necessary and in other embodiments, region 68 may be localized to be substantially adjacent to sidewall 27 where induced channel 29 illustrated in FIG. 27 forms. Either arrangement is useful. Structure 619 results.

Figure 20:
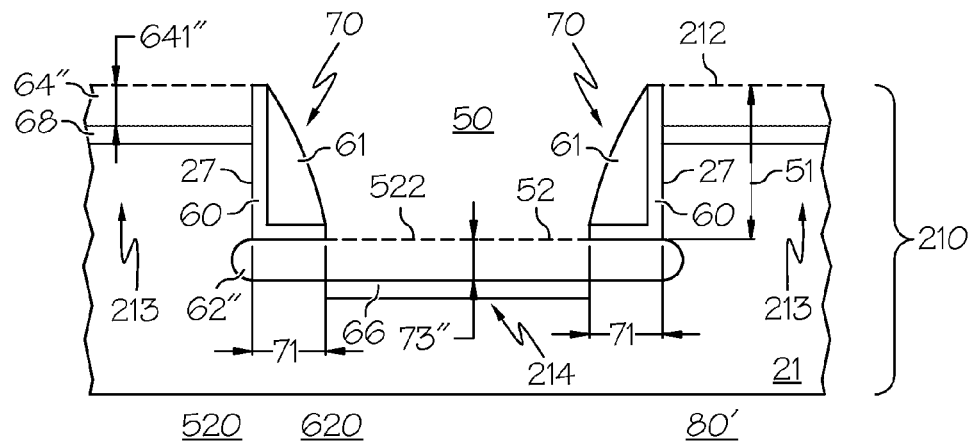
Figure 21:
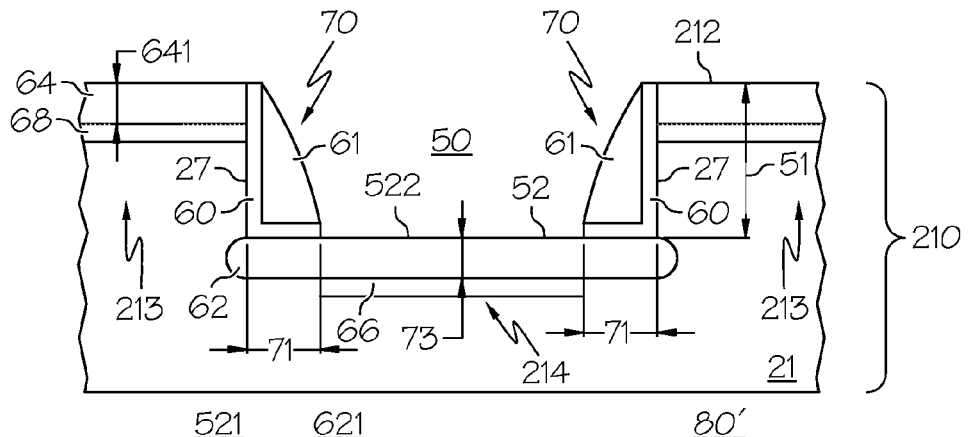

Referring now to manufacturing stages 520 of FIGS. 20 and 521 of FIG. 21, except for the presence of doped regions 68 and 66, these manufacturing stages are analogous to manufacturing stages 515 of FIG. 15 and 516 of FIG. 16, and the discussion thereof is included herein by reference. Structure 621 results.

Figure 22:
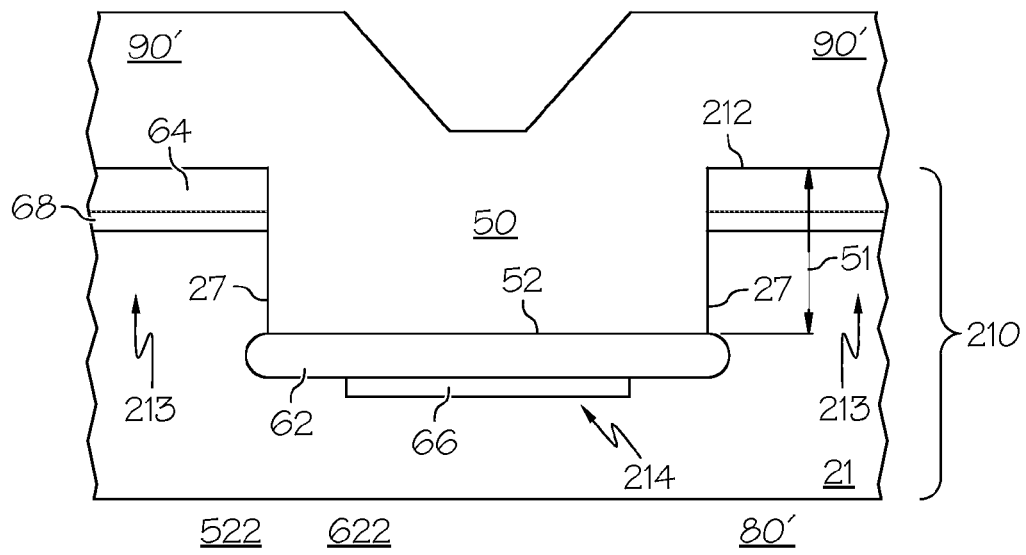

Referring now to manufacturing stage 522 of FIG. 22, sidewall protector 70 is removed from structure 621 and layer 90' is deposited over device 80'. Layer 90' is used to form a dummy gate, that is, a place-holder for gate 98 of FIGS. 26-27, analogous to gate 28 described previously. The material of layer 90' does not remain in the final structure of MOSFET 80' and performs no electrical function. Accordingly, any material that is substantially differentially etchable with respect to substrate 21 may be used for layer 90'. Silicon nitride, silicon oxide and combinations thereof are non-limiting examples of suitable materials for layer 90', but other materials may also be used. It is desirable that layer 90' is thick enough to substantially fill cavity 50 but thicker and thinner layers may also be used. Structure 622 results.

Figure 23:
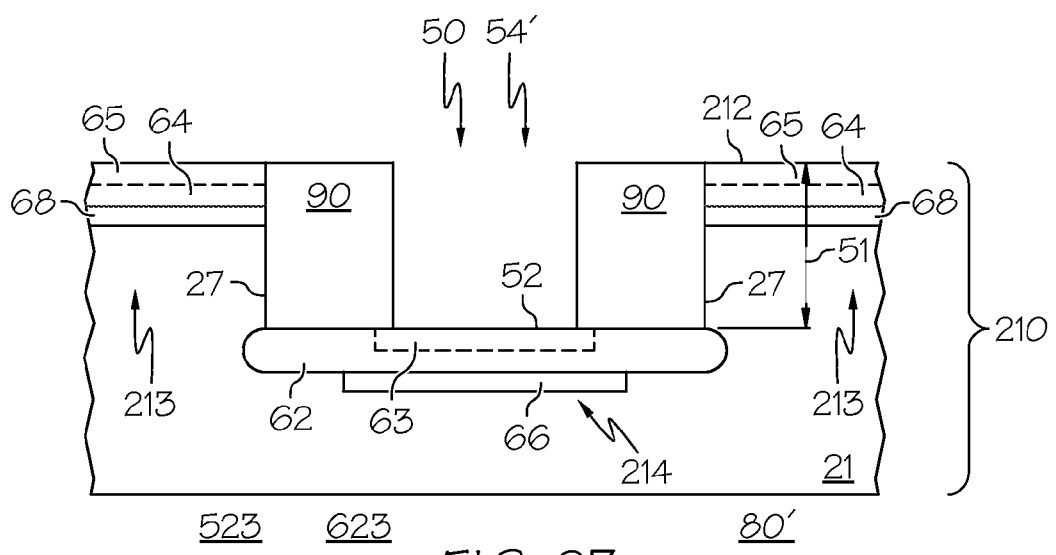
Figure 24:
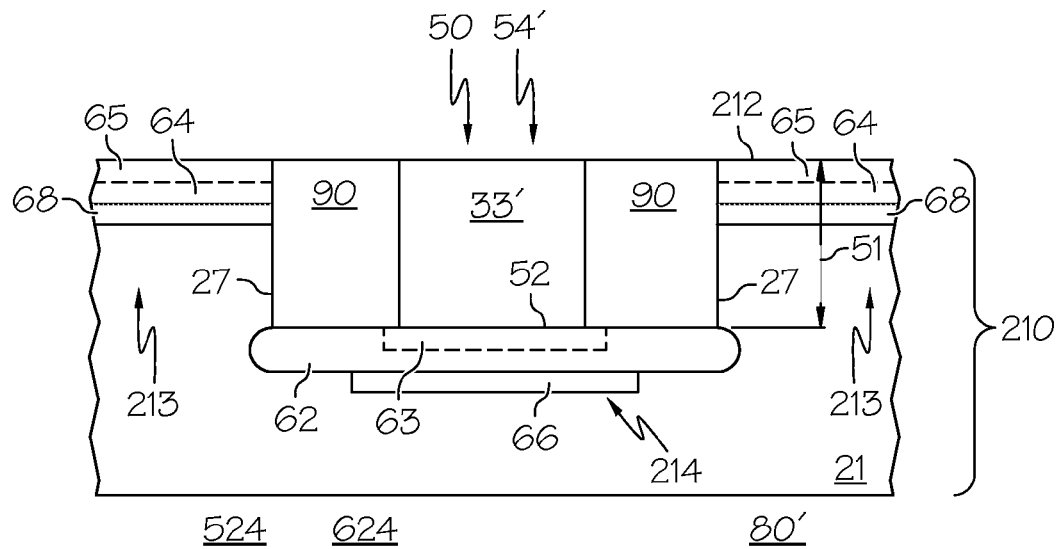

Referring now to manufacturing stage 523 of FIG. 23, structure 622 is planarized (e.g., using CMP), masked (e.g., using photo-resist) and etched to provide central cavity 54' approximately similar to cavity 54 previously described (e.g., see FIG. 8) with adjacent dummy gate 90 located against sidewall 27, i.e., in substantially the same location as occupied by real gate 28 and associated gate dielectric 26 of FIGS. 1-2. Metal-SC alloy contact region 63 is formed in doped region 62 using cavity 54' and metal-SC alloy contact region 65 is formed in doped region 64, in substantially the same manner as previously described for contact regions 23, 25 in connection with FIG. 9, the discussion of which is incorporated herein by reference. Structure 623 results. Referring now to manufacturing stage 524 of FIG. 24, cavity 54' is filled with dielectric 33' analogous to central dielectric region 33 and planarized, as described for example in connection with FIGS. 10 and 11, the discussion of which is incorporated herein by reference. Central dielectric region 33' is approximately analogous to dielectric region 33 of FIG. 11 but is laterally bounded by dummy gate 90 rather than gate 28. Structure 624 results.

Figure 25:
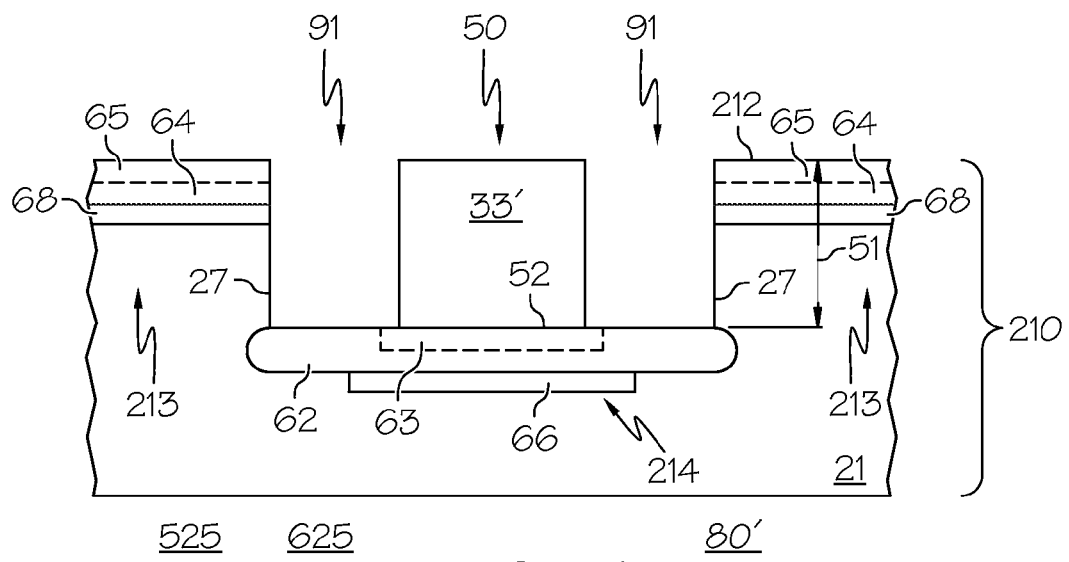
Figure 26:
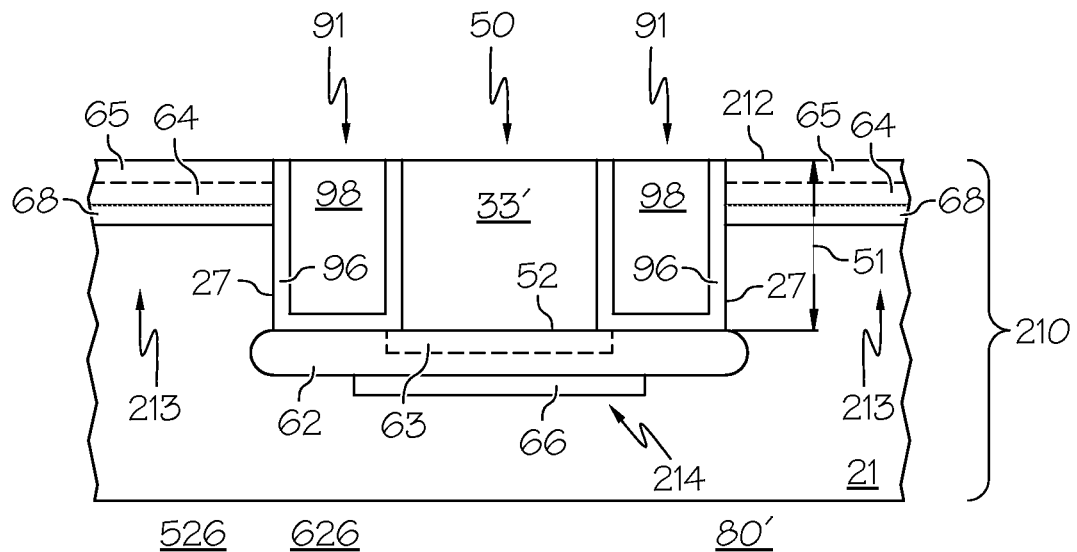

Referring now to manufacturing stage 525 of FIG. 25, structure 624 is etched to remove dummy gates 90, leaving substantially annular cavity 91 is its place, in which sidewall 27 is exposed as is the portion of doped region 62 underlying cavity 91. Structure 625 results. Referring now to manufacturing stage 526 of FIG. 26, cavity 91 has gate dielectric liner 96 provided therein, covering sidewall 27 and the exposed portion of underling doped region 62 and contact region 63. Gate dielectric liner 96 serves as the gate insulator of MOSFET 80' and any material and thickness suitable for this purpose may be used for liner 96. Such choices are within the competence of those of skill kin the art. Silicon oxide, silicon nitride and combinations thereof are non-limiting examples of suitable materials for dielectric liner 96, but other insulating materials may also be used, including materials having relatively high dielectric constants, that is, dielectric constants greater than about 4. The remaining empty portion of cavity 91 is filled with gate conductor 98 and planarized. Gate conductor 98 is functionally analogous to gate conductor 28 already described. However, unlike gate conductor 28, since gate conductor 98 is formed after many of the other regions of device 80' have already been formed, most of the high temperature operations associated with forming device 80' and metal-SC alloy regions 63, 65 have already been provided, so much grater freedom is available regarding the choice of conductor for gate 98. For example and not intended to be limiting, metals, semi-metals, semiconductors, doped-semiconductors, conductive mixtures, alloys and combinations thereof are all useful. TiN is preferred. Structure 626 results.

Structure 626 may be used as is or provided with further overlying dielectric layers and electrical contacts or interconnections, as is common in the art. Referring now to manufacturing stage 527, structure 626 has dielectric layer 34 formed thereon, vias corresponding to the desired locations of electrical connections 42, 48, 44 provided therein (and through dielectric region 33' in the case of conductor 42), which are then filled with electrical conductors to form electrical connections to doped (source or drain) region 62, gate 98 and doped (drain or source) region 64, respectively. Structure 627 results wherein channel length 30' is determined substantially by the combination of cavity etch depth 51 and epi-depth 641 (equivalent to doping-depth 241) of doped region 64 plus any further depth provided by underlying doped region 68. Induced channel 29'—will form when gate 28 is appropriately biased, as has been previously discussed. Further dielectric layers and interconnections may also be provided depending upon the particular device structure or integrated circuit being formed.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A method of forming a non-planar field effect transistor (FET), comprising:
   providing a substrate having a first surface;
   forming a cavity extending into the substrate a first distance to a bottom thereof, wherein the cavity is bounded by a first sidewall and a second sidewall, with each sidewall extending between the bottom and the first surface;
   forming first doped regions in the substrate proximate the first surface and laterally adjacent to each sidewall;
   forming a second doped region in the substrate proximate the bottom of the cavity and extending laterally within each sidewall;
   forming a gate insulator on each sidewall;
   forming a first gate conductor in contact with the gate insulator adjacent the first sidewall and overlying the second doped region;
   forming a second gate conductor in contact with the gate insulator adjacent the second sidewall and overlying the second doped region;
   forming a dielectric material between the first gate conductor and the second gate conductor; and
   forming first, second and third electrical connections, respectively, to the first doped region, the second doped region and the first gate conductor.

2. The method of claim 1, wherein the first and second doped regions are formed substantially at the same time.

3. The method of claim 2, wherein the first and second doped regions are formed substantially by doping the substrate.

4. The method of claim 1, further comprising, forming first and second metal-semiconductor alloy contact regions, respectively in Ohmic contact with the first and second doped regions.

5. The method of claim 4, wherein forming the first doped region and the first contact region comprise forming them with substantially coincident lateral areas.

6. The method of claim 5, wherein forming the second doped region and the second contact region comprise forming them with substantially unequal lateral areas.

7. The method of claim 4, further comprising forming gate dielectric after forming the first contact region.

8. The method of claim 1 wherein forming a first gate conductor and forming a second gate conductor comprise:
   depositing a gate conductor material in contact with the gate insulator adjacent the first sidewall and the second sidewall and overlying the second doped region; and
   etching a cavity into the gate conductor material to form the first gate conductor and the second gate conductor.

9. The method of claim 8 wherein etching a cavity into the gate conductor material to form the first gate conductor and the second gate conductor comprises etching through a portion of the gate insulator overlying the second doped region.

10. The method of claim 8 wherein etching a cavity into the gate conductor material to form the first gate conductor and the second gate conductor comprises exposing a portion of the second doped region.

11. The method of claim 1 wherein a cavity is defined between the first gate conductor and the second gate conductor, and wherein forming a dielectric material between the first gate conductor and the second gate conductor comprises:
   depositing a dielectric layer overlying the first gate conductor and the second gate conductor and in the cavity; and
   removing a portion of the dielectric layer overlying the first gate conductor and the second gate conductor.

12. The method of claim 1 further comprising forming a fourth electrical connection to the second gate conductor.

13. A method of forming a non-planar field effect transistor (FET), comprising:
   providing a substrate having a first surface;

forming a cavity extending into the substrate a first distance to a bottom thereof, and with a sidewall extending between the bottom and the first surface;

forming a first doped regions in the substrate proximate the first surface and laterally adjacent to the sidewall;

forming a second doped region in the substrate proximate the bottom of the cavity and extending laterally within the sidewall;

forming a gate insulator on the sidewall;

forming a gate conductor in contact with the gate insulator and overlying the second doped region; and forming first, second and third electrical connections, respectively, to the first doped region, the second doped region and the gate conductor, wherein the first and second doped regions are formed substantially by etching away a first portion of the substrate adjacent the first surface and etching away a second portion of the substrate adjacent the bottom and epitaxially refilling the first and second portions of the substrate to form therein the first doped region and the second doped region, respectively.

14. The method of claim 13, wherein epitaxially refilling comprises epitaxially refilling with substantially the same semiconductor material as the substrate.

15. The method of claim 13, wherein epitaxially refilling comprises epitaxially refilling with semiconductor material having a lattice constant different than a lattice constant of the substrate.

16. A method for forming a non-planar field effect transistor (FET), comprising:

providing a semiconductor (SC) substrate of a first conductivity type and having a first surface;

forming a cavity in the substrate having a bottom at a first depth from the first surface and a sidewall extending therebetween;

forming a protective liner on the sidewall;

excavating a first part of the substrate proximate the surface of the substrate laterally outside of the sidewall;

isotropically excavating a second part of the substrate proximate the bottom and extending laterally to or beyond the sidewall;

epitaxially refilling the first part of the substrate to a first depth to form a first region of a second, opposite, conductivity type proximate the first surface of the substrate adjacent the sidewall;

epitaxially refilling the second part of the substrate to form a second region of the second conductivity type proximate the bottom and extending to or beyond the sidewall;

forming a gate insulator on the sidewall; and forming a gate conductor on the gate insulator opposite the sidewall and overlying a part of the second region.

17. The method of claim 16, further comprising, providing a first connection coupled to the first region and a second connection coupled to the second region and a third connection coupled to the gate conductor, the first, second and third connections extending at least to the first surface.

18. The method of claim 16, wherein epitaxially refilling comprises epitaxially refilling with one or more strain inducing materials having one or more different lattice constants different than the substrate.

19. The method of claim 16, wherein forming the gate conductor comprises:

forming a dummy gate laterally in contact with the sidewall;

removing the dummy gate;

forming the gate insulator in contact with the sidewall; and forming the gate conductor in contact with the gate insulator.

20. The method of claim 16, wherein forming the gate conductor comprises:

forming a dummy gate laterally in contact with the sidewall;

forming a dielectric region laterally adjacent the dummy gate;

creating a void between the sidewall and the dielectric region by removing the dummy gate;

providing the gate insulator on the sidewall and a portion of the second region underlying the void; and forming the gate conductor in a remaining portion of the void at least in contact with the gate insulator.

* * * * *